United States Patent
Hannu et al.

(10) Patent No.: US 6,963,587 B2
(45) Date of Patent: Nov. 8, 2005

(54) COMMUNICATION SYSTEM AND METHOD UTILIZING REQUEST-REPLY COMMUNICATION PATTERNS FOR DATA COMPRESSION

(75) Inventors: Hans Hannu, Lulea (SE); Jan Christoffersson, Lulea (SE); Krister Svanbro, Lulea (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 830 days.

(21) Appl. No.: 09/814,407

(22) Filed: Mar. 21, 2001

(65) Prior Publication Data

US 2002/0057715 A1 May 16, 2002

Related U.S. Application Data

(60) Provisional application No. 60/249,642, filed on Nov. 16, 2000.

(51) Int. Cl.[7] .................................................. H04J 3/18
(52) U.S. Cl. ....................................... 370/477; 709/247
(58) Field of Search ................................. 370/477, 238, 370/310, 474, 389–395, 516, 521; 709/247, 200–211; 341/106, 51, 60–65, 87; 375/240; 455/72

(56) References Cited

U.S. PATENT DOCUMENTS

| | | | | |
|---|---|---|---|---|
| 5,293,379 A | * | 3/1994 | Carr ............................ | 370/474 |
| 5,537,551 A | * | 7/1996 | Denenberg et al. ......... | 709/247 |
| 5,841,971 A | * | 11/1998 | Longginou et al. ......... | 709/200 |
| 6,067,381 A | | 5/2000 | Benayoun et al. .......... | 382/232 |
| 6,192,259 B1 | * | 2/2001 | Hayashi .................... | 455/575.1 |
| 6,222,942 B1 | * | 4/2001 | Martin ........................ | 382/232 |
| 6,246,672 B1 | * | 6/2001 | Lumelsky ................... | 370/310 |
| 6,345,307 B1 | * | 2/2002 | Booth ......................... | 709/247 |
| 6,680,955 B1 | * | 1/2004 | Le ............................ | 455/575.1 |
| 6,711,164 B1 | * | 3/2004 | Le et al. ..................... | 370/392 |

FOREIGN PATENT DOCUMENTS

| | | |
|---|---|---|
| JP | 9224018 | 8/1997 |
| WO | WO 01/56169 A1 | 8/2001 |

OTHER PUBLICATIONS

Luiz M. Alves Dos Dantos, Multimedia Data and Tools for Web Services over Wireless Platforms, Oct. 1998, IEEE Personal Communciation, vol. 5, No. 5, pp. 42–46.*

"The Prevention of Error Propagation in Dictionary Compressionwith Update and Deletion" by James A. Storer form the Data Compression Conference in 1998, pp. 199–208.

Deutsch, P. "Deflate Compressed Data Format Specification version 1.3."IETF RFC 1951. (1996). Pp. 1–17.

Bormann C., et al. (2000) Robust Header Compression (ROHC). Internet Draft (work in progress), Oct. 2000, °draft–ietf–rohc–rpt–05.txt< Pp. 1–156.

* cited by examiner

Primary Examiner—Chi Pham
Assistant Examiner—Prenell Jones

(57) ABSTRACT

A method, system, and apparatus for increasing the efficiency and robustness of the compression of a communication protocol for communication between entities over bandwidth limited communication links. The present invention uses the request-reply nature of communication protocols to update compression and decompression dictionaries. Each communication entity will update its dictionary with a new message as soon as it is known that the other communication entity has access to the message. In one aspect of the present invention, an entity updates a compression/decompression dictionary by updating the dictionary with sent messages as soon as a reply arrives from the other entity, and by updating the dictionary with received messages immediately. In another aspect of the present invention, received messages are used to update an entity's decompression dictionary and sent messages are used to update an entity's compression dictionary.

13 Claims, 4 Drawing Sheets

COMMUNICATION SYSTEM AND METHOD UTILIZING REQUEST-REPLY COMMUNICATION PATTERNS FOR DATA COMPRESSION

CROSS-REFERENCE TO RELATED APPLICATIONS

This patent application is related to and claims priority from U.S. patent application Ser. No. 60/249,642, filed Nov. 16, 2000; U.S. patent application Ser. No. 09/814,406 filed concurrently herewith, entitled "Static Information Knowledge Used With Binary Compression Method"; U.S. patent application Ser. No. 09/814,268 filed concurrently herewith, entitled "System and Method For Communicating With Temporary Compression Tables"; and U.S. patent application Ser. No. 09/814,434 filed concurrently herewith, entitled "Communication System and Method For Shared Contest Compression".

BACKGROUND OF THE INVENTION

1. Technical Field of the Invention

The present invention relates to improved compression for data protocols, e.g. Internet protocols.

2. Background and Objects of the Present Invention

Two communication technologies that have become widely used by the general public in recent years are cellular telephony and the Internet. Some of the benefits that have been provided by cellular telephony have been freedom of mobility and accessability with reasonable service quality despite a user's location. Until recently the main service provided by cellular telephony has been speech. In contrast, the Internet, while offering flexibility for different types of usage, has been mainly focused on fixed connections and large terminals. However, the experienced quality of some services, such as Internet telephony, has generally been regarded as quite low.

A number of Internet Protocols (IPs) have been developed to provide for communication across the Internet and other networks. An example of an Internet protocol is the Session Initiation Protocol (SIP). SIP is an application layer protocol for establishing, modifying, and terminating multimedia sessions or calls. These sessions may include Internet multimedia conferences, Internet telephony, and similar applications. SIP can be used over either the Transmission Control Protocol (TCP) or the User Datagram Protocol (UDP).

Another example of an Internet Protocol is the Real Time Streaming Protocol (RTSP), which is an application level protocol for control of the delivery of data with real-time properties, such as audio and video data. RTSP may also be used with UDP, TCP, or other protocols as a transport protocol. Still another example of an Internet Protocol is the Session Description Protocol (SDP), which is used to advertise multimedia conferences and communicate conference addresses and conference tool-specific information. It is also used for general real-time multimedia session description purposes. SDP is carried in the message body of SIP and RTSP messages. SIP, RTSP, and SDP are all ASCII text based using the ISO 10646 character set in UTF-8 encoding.

Due to new technological developments, Internet and cellular telephony technologies are beginning to merge. Future cellular devices will contain an Internet Protocol (IP) stack and support voice over IP as well as web-browsing, e-mail, and other desirable services. In an "all-IP" or "IP all the way" implementation, Internet Protocols are used end-to-end in the communication system. In a cellular system this may include IP over cellular links and radio hops. IP may be used for all types of traffic including user data, such as voice or streaming data, and control data, such as SIP or RTSP data. Such a merging of technologies provides for the flexibility advantages of IP along with the mobility advantages of cellular technology.

The SIP, RTSP, and SDP protocols share similar characteristics which have implications in their use with cellular radio access. One of these similarities is the general request and reply nature of the protocols. Typically, when a sender sends a request, the sender stays idle until a response is received. Another similarity is that SIP, RTSP, and SDP are all ASCII text based using the ISO 10646 character set with UTF-8 encoding. As a result, information is usually represented using a greater number of bits than would be required in a binary representation of the same information. Still another characteristic that is shared by the protocols is that they are generally large in size in order to provide the necessary information to session participants.

A disadvantage with IP is the relatively large overhead the IP protocol suite introduces due to large headers and text-based signaling protocols. It is very important in cellular systems to use the scarce radio resources in an efficient way. It must be possible to support a sufficient number of users per cell, otherwise costs will be prohibitive. Frequency spectrum, and thus bandwidth, is a costly resource in cellular links and must be used carefully.

In the UMTS and EDGE mobile communication systems and in future releases of second generation systems, such as GSM and IS-95, much of the signaling traffic will be performed by using Internet protocols. However as discussed, most of the Internet protocols have been developed for fixed, relatively broadband connections. When access occurs over narrow band cellular links, compression of the protocol messages is needed to meet quality of service requirements, such as set-up time and delay. Typically, compression over the entire communication path is not needed. However, compression of traffic over the radio link, such as from a wireless user terminal to a core network, is greatly desirable.

Standard binary compression methods, such as Lempel-Ziv and Huffman coding, are very general in the sense that they do not utilize any explicit knowledge of the structure of the data to be compressed. The use of such methods on Internet data protocols, e.g., SIP and RTSP, present difficulties for the efficient compression of communication methods. Standard binary compression methods available today are typically designed for large data files. As a consequence, use of such methods for small messages or messages with few repeated strings results in compression performance which is generally very poor. In fact, if the message to be compressed is small and/or contains few repeated strings, the use of some standard compression methods may result in a compressed packet which is actually larger than the original uncompressed packet, thereby achieving a counter-productive result.

Huffman compression is a general compression method intended primarily for compression of ASCII files. Characters occurring frequently in the files are replaced by shorter codes, i.e. codes with less than the 8 bits used by the ASCII code. Huffman compression can be successful in files where relatively few characters are used.

Another method for the compression of data is the use of dictionary based compression techniques. In general, a dictionary compression scheme uses a data structure known as a dictionary to store strings of symbols which are found in the input data. The scheme reads in input data and looks for strings of symbols which match those in the dictionary. If a string match is found, a pointer or index to the location of that string in the dictionary is output and transmitted instead of the string itself. If the index is smaller than the string it replaces, compression will occur. A decompressor contains a representation of the compressor dictionary so that the original string may be reproduced from the received index. An example of a dictionary compression method is the Lempel-Ziv (LZ77) algorithm. This algorithm operates by replacing character strings which have previously occurred in the file by references to the previous occurrence. This method is successful in files where repeated strings are common.

Dictionary compression schemes may be generally categorized as either static or dynamic. A static dictionary is a predefined dictionary, which is constructed before compression occurs that does not change during the compression process. Static dictionaries are typically either stored in the compressor and decompressor prior to use, or transmitted and stored in memory prior to the start of compression operations.

A dynamic or adaptive dictionary scheme, on the other hand, allows the contents of the dictionary to change as compression occurs. In general a dynamic dictionary scheme starts out with either no dictionary or a default, predefined dictionary and adds new strings to the dictionary during the compression process. If a string of input data is not found in the dictionary, the string is added to the dictionary in a new position and assigned a new index value. The new string is transmitted to the decompressor so that it can be added to the dictionary of the decompressor. The position of the new string does not have to be transmitted, as the decompressor will recognize that a new string has been received, and will add the string to the decompressor dictionary in the same position in which it was added in the compressor dictionary. In this way, a future occurrence of the string in the input data can be compressed using the updated dictionary. As a result, the dictionaries at the compressor and decompressor are constructed and updated dynamically as compression occurs.

A general criteria for successful compression using the aforementioned binary compression algorithms is that the file to be compressed is reasonably large. This is a consequence of the compression algorithms. The codes for Huffman compression must not be too large compared to the file which is being compressed. For standard Lempel-Ziv compression, the file to be compressed must be large enough to have many repeated strings to achieve efficient compression. The messages produced by the aforementioned protocols are mostly a few hundred bytes and not large enough to allow efficient compression with the aforementioned algorithms on a message by message basis.

Thus, a need exists in the art for a method to increase the efficiency of dictionary compression methods so that they may be used to compress messages which are transmitted between communication entities over bandwidth limited communication links using communication protocols. The updating of the compression and decompression dictionaries should be performed as quickly as possible since the size of the dictionary has a large effect on the compression efficiency. In addition, the method should be robust so that lost packets do not make compression of the subsequent messages impossible.

SUMMARY OF THE INVENTION

The present invention is directed to a method, system, and apparatus for increasing the efficiency and robustness of the compression of a communication protocol for communication between entities over bandwidth limited communication links. The present invention uses the request-reply nature of communication protocols to update compression and decompression dictionaries. Each communication entity will update its dictionary with a new message as soon as it is known that the other communication entity has access to the message. In one aspect of the present invention, an entity updates a compression/decompression dictionary by updating the dictionary with sent messages as soon as a reply arrives from the other entity, and by updating the dictionary with received messages immediately. In another aspect of the present invention, received messages are used to update an entity's decompression dictionary and sent messages are used to update an entity's compression dictionary.

BRIEF DESCRIPTION OF THE DRAWINGS

A more complete understanding of the system, method and apparatus of the present invention may be had by reference to the following Detailed Description when taken in conjunction with the accompanying Drawings wherein.

DETAILED DESCRIPTION OF THE PRESENTLY PREFERRED EXEMPLARY EMBODIMENTS

The present invention will now be described more fully hereinafter with reference to the accompanying Drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
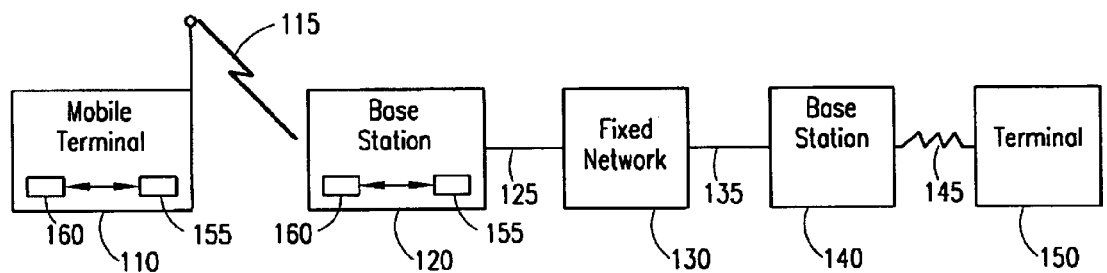
FIG. 1 illustrates an exemplary system for communication in accordance with the present invention.

FIG. 1 illustrates an exemplary system for communication in accordance with the present invention. A mobile terminal 110 is in communication with a base station 120 using communication protocols over a communication link 115, e.g. a wireless link. The base station 120 is in communication with a fixed network 130, such as a PSTN, via a link 125. Fixed network 130 is in communication with a base station 140 via a link 135. Base station 140 is in communication with a terminal 150, which may be a mobile terminal or a fixed terminal, using communication link 145. According to an embodiment of the present invention, the mobile terminal 110 communicates with the base station 120 using compressed data over the communication link 115. Similarly, base station 140 may communicate with terminal 150 using compressed data. It should be understood that components in the system of FIG. 1, such as mobile terminal 110 and base station 140, may include a memory 160 and processor 155 used for storing and executing software instructions which implement compression and decompression algorithms. It should also be understood that the present invention may be used in other communication systems, such as a cellular network, that use communication protocols over links in which compression is desired.

Figure 2:
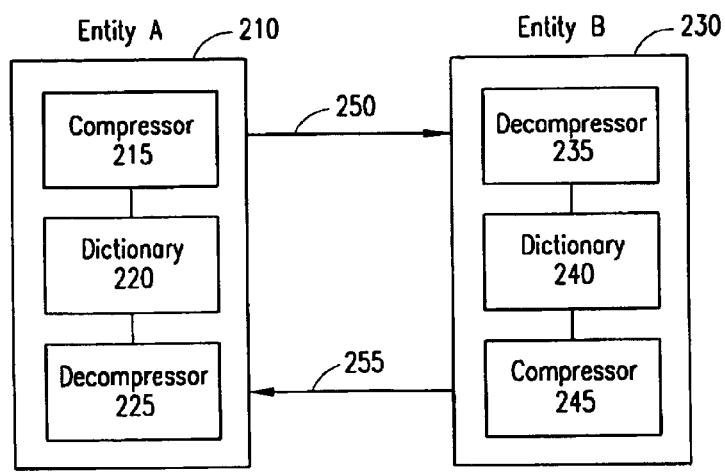
FIG. 2 illustrates an exemplary embodiment in accordance with the present invention.

FIG. 2 illustrates an exemplary embodiment of the present invention. In this embodiment an entity A (210) communicates with an entity B (230) using communication links (250, 255) with a communication protocol in which a dictionary data compression method is used. Entity A (210) includes a compressor 215 for compressing data to be transmitted to entity B (230) over communication link 250, and a decompressor 225 for decompressing data received from entity B (230) over communication link 255. Entity A (210) contains a dictionary 220 which is associated with compressor 215 and decompressor 225. It should be understood that the compressor and/or decompressor may be implemented using a processor and associated memory having stored therein instructions for a compression/decompression algorithm(s). It should also be understood that the communication entities may comprise a number of communication devices. For example, entity A may comprise a mobile terminal, and entity B may comprise a base station.

During operation, the compressor 215 and decompressor 225 use the shared dictionary 220 for the compression and decompression of messages. Entity B (230) contains a decompressor 235 for decompressing data received from communication link 250 and a compressor 245 for compressing data to be transmitted over communication link 255. Entity B (230) contains a dictionary 240 associated with decompressor 235 and compressor 245. During operation, the decompressor 235 and compressor 245 use the shared dictionary 240 for the compression and decompression of messages.

Figure 3:
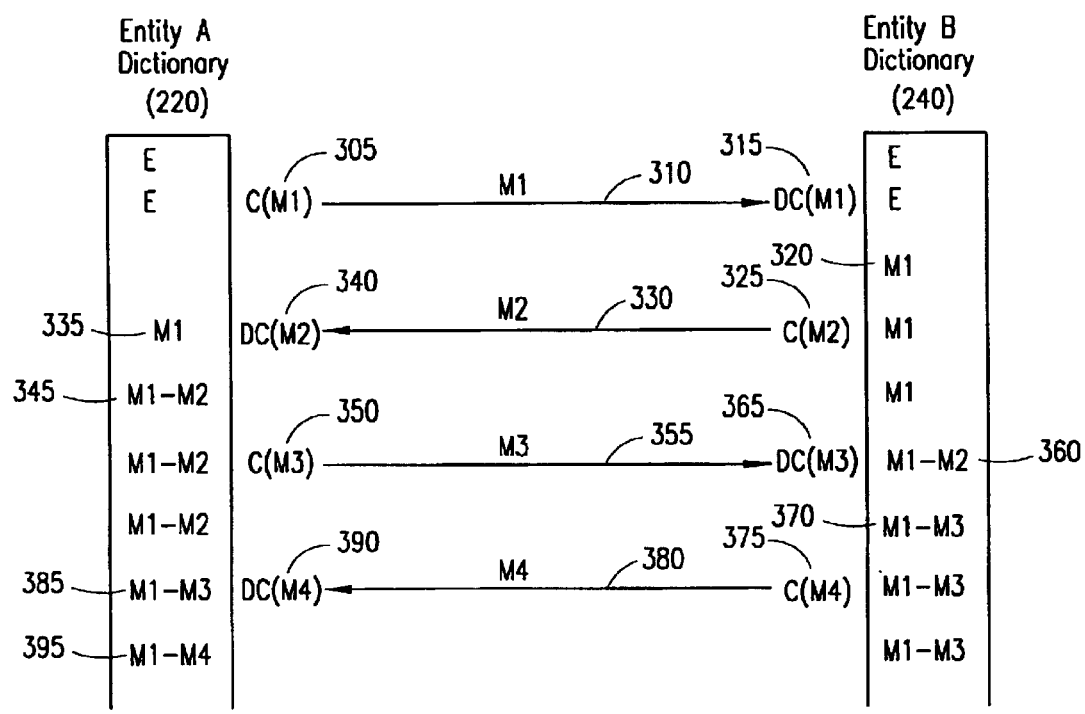
FIG. 3 illustrates an exemplary method of data compression in accordance with the invention of FIG. 2.

FIG. 3 illustrates an exemplary method of data compression in accordance with the invention of FIG. 2. In this exemplary method, the reply-request nature of communication protocols is used to update compression dictionaries at each communication entity. According to this method, entity A (210) and entity B (230) communicate using compressed messages over communication links (250,255) through the use of a communication protocol. At the start of a communication session each entity may begin with an empty dictionary which is updated during the communication session. Alternately, the entities may begin with the same default dictionaries which are then updated during the communication session. The general method of updating compression/decompression dictionaries according to the present method is for each entity to update its dictionary with a particular message as soon as it is known that the other entity has access to that particular message.

According to this exemplary method, an entity will update its dictionary with a message which it has sent as soon as a reply arrives from the other entity indicating that it has received the message. Consequently, an entity will update its dictionary with a received message immediately upon arrival. It should be understood that a dictionary need not be updated with an entire message of the communication protocol. Alternately, only portions of a message in which it would be beneficial to be added to the compression dictionary may be compressed using the current method. This portion of the message may be compressed using the method of the present invention while the remainder of the message may be sent in an uncompressed format or be compressed using an alternate method known to one skilled in the art.

In the exemplary illustration of FIG. 3, flow arrows indicate the message flow (M1–M4) between entity A (210) and entity B (230) during an exemplary communication session. The dictionary columns indicate the contents of entity A's dictionary (220) and entity B's dictionary (240) at given instances during the communication session. The notation of E represents an empty dictionary, while the notation Mn–Mm represents messages n through m as being in the dictionary at that current instant. The notations of C(M) and DC(M) represent the respective compression and decompression of message M using the current dictionary as indicated in the dictionary column.

In this exemplary illustration, entity A (210) and entity B (230) both begin with empty dictionaries (E) prior to the start of the communication session. Entity A prepares to send a first request message, M1, to entity B. M1 is compressed using entity A's empty dictionary (step 305). Entity A temporarily stores M1 in memory and sends the compressed version of M1 to entity B (step 310). When entity B receives the compressed message M1, it decompresses the compressed message M1 using its current empty dictionary (E) to reproduce the original message M1 (step 315). After decompression of the message M1, entity B adds M1 to its dictionary (step 320).

When entity B prepares to send a response or reply message, M2, to entity A, entity B compresses M2 by using the dictionary containing M1 (step 325), i.e. by replacing strings in M2 that were also in M1 with a reference to their location in the dictionary. Entity B then temporarily stores M2 in memory and sends the compressed version of M2 to entity A (step 330). When entity A receives the compressed M2 reply message, entity A adds M1 to its dictionary (step 335) and decompresses M2 using the updated dictionary now containing M1 (step 340). Entity A then appends M2 to its dictionary so that the dictionary now contains both M1 and M2 (step 345).

Further requests and responses are performed in the same manner. For example, entity A prepares to send another request M3 to entity B by first compressing M3 using entity A's current dictionary of M1 and M2 (step 350). In addition, entity A temporarily stores M3 in memory. Entity A then sends the compressed M3 message to entity B (step 355). When entity B receives the compressed message M3, it adds M2 to its dictionary (step 360) and decompresses M3 using its current dictionary containing M1 and M2 (step 365). Entity B then adds M3 to its dictionary (step 370).

When entity B sends a response, M4, to entity A, entity B compresses M4 using the dictionary containing M1–M3 (step 375). Entity B temporarily stores M4 and sends the compresses message M4 to entity A (step 380). When entity A receives the response message M4, entity A adds M3 to its dictionary (step 385) and decompresses M4 using the dictionary containing M1–M3 (step 390). Entity A then adds M4 to its dictionary (step 395) to be used in the compression and decompression of further messages. As should be understood by the above description, both communication entities maintain identically updated dictionaries for compression and decompression of communication protocol messages.

Figure 4:
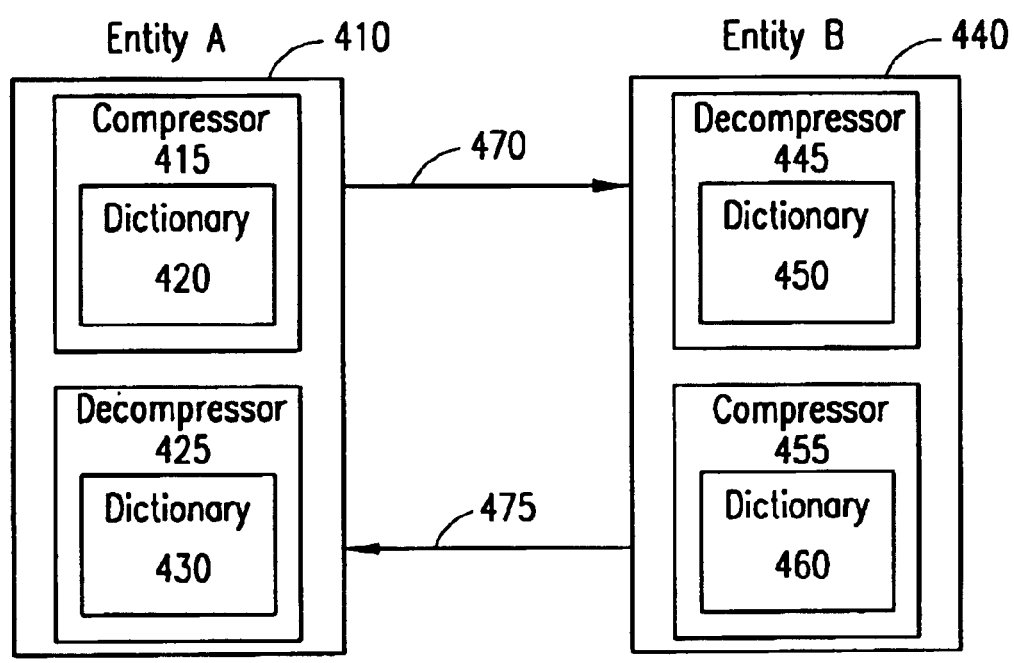
FIG. 4 illustrates another exemplary embodiment in accordance with the present invention.

FIG. 4 illustrates another exemplary embodiment in accordance with the present invention. In this embodiment an entity A (410) communicates with entity B (440) using communication links (470, 475) in which a dictionary compression method is used. Entity A (410) includes a compressor 415 for compressing data to be transmitted to entity B (440) over communication link 470, and a decompressor 425 for decompressing data received from entity B (440) using communication link 475. Entity B (440) contains a decompressor 445 for decompressing data received from communication link 470, and a compressor 455 for compressing data to be transmitted over communication link 475 to entity A (410).

In this embodiment, the compressor and decompressor in each entity are not configured to communicate with one another in regards to compression and decompression operations. As a result, each entity must maintain separate dictionaries for compression and decompression. The compressor 415 of entity A (410) includes an associated compression dictionary 415 and decompressor 425 of entity A (410) includes an associated decompression dictionary 430. Similarly, the decompressor 445 of entity B (440) includes an associated decompression dictionary 450 and compressor 455 of the entity B (440) includes an associated decompression dictionary 460. In this embodiment, the previous method is modified such that received messages are used to update the decompression dictionaries in each entity, while sent messages are used to update the compression dictionaries of each entity as soon as the entity is aware that the sent message was received. As a result, an entity will not have the same dictionary for compression and decompression. During a communication session, the contents of entity A's compression dictionary 420 will correspond to the contents of entity B's decompression dictionary 450, and entity B's compression dictionary 460 will correspond to the contents of entity A's decompression dictionary 430.

Figure 5:
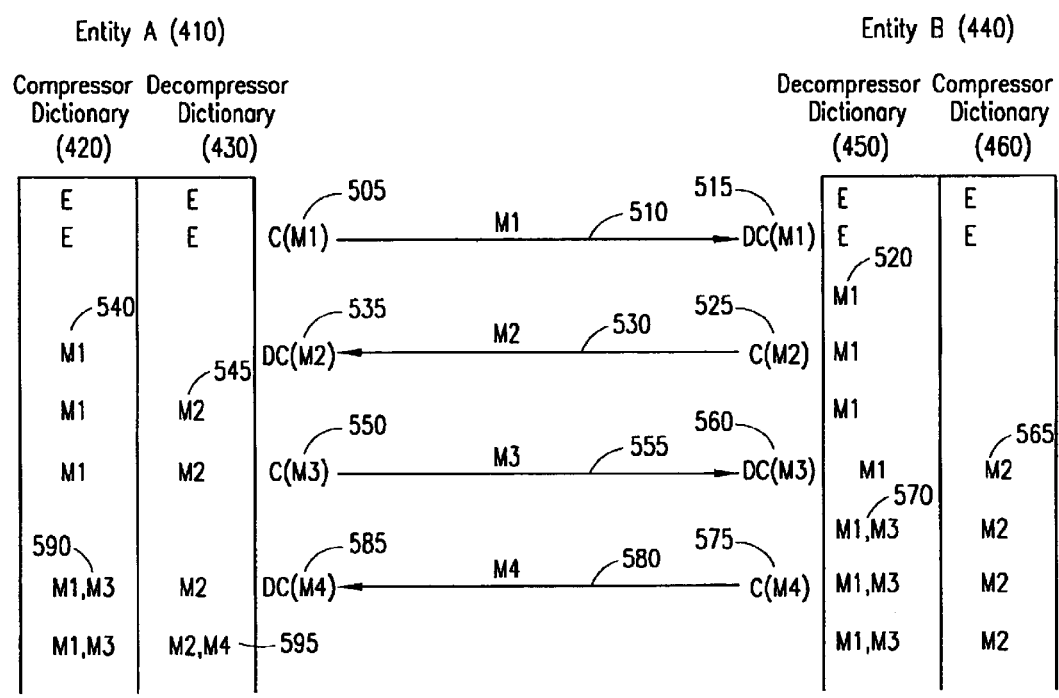
FIG. 5 illustrates an exemplary method of data compression in accordance with the invention of FIG. 4.

In the exemplary illustration of FIG. 5, flow arrows indicate the message flow (M1–M4) between entity A (410) and entity B (440) during an exemplary communication session. The dictionary columns indicate the contents of entity A's compressor dictionary (420) and decompressor dictionary (430), and entity B's decompressor dictionary (450) and compressor dictionary (460) at given instances during the communication session. The notation of E represents an empty dictionary, while the notation Mn–Mm represents messages n through m as being in the dictionary at that current instant. The notations of C(M) and DC(M) represent the respective compression and decompression of message M using the current compressor or decompression dictionary of each entity, as indicated in the dictionary columns.

In this exemplary illustration, compressor dictionary (420) and decompressor dictionary (430) of entity A (410), and decompressor dictionary (450) and compressor dictionary (460) of entity B (440) begin with empty dictionaries (E) prior to the start of the communication session. Entity A prepares to send a first request message, M1, to entity B. M1 is compressed using entity A's empty compressor dictionary (420) (step 505). Entity A (410) temporarily stores M1 in memory and sends the compressed version of M1 to entity B (step 510). When entity B receives the compressed message M1, it decompresses the compressed message M1 using its current empty decompressor dictionary (450) to reproduce the original message M1 (step 515). After decompression of the message M1, entity B adds M1 to its decompressor dictionary (450) (step 520).

When entity B prepares to send a response or reply message, M2, to entity A, entity B compresses M2 by using currently empty compressor dictionary (460) (step 525). Entity B then temporarily stores M2 in memory and sends the compressed version of M2 to entity A (step 530). When entity A receives the compressed M2 reply message, entity A decompresses M2 using the currently empty decompressor dictionary (430) (step 535). The received message M2 serves as an implicit acknowledgment to entity A that message M1 was received by entity B. As a result, entity A adds M1 to its compressor dictionary (420) (step 540). Entity A also adds M2 to its decompressor dictionary (430) (step 545).

Further requests and responses are performed in the same manner. For example, entity A prepares to send another request M3 to entity B by first compressing M3 using entity A's current compressor dictionary (420) containing M1 (step 550). In addition, entity A temporarily stores M3 in memory. Entity A then sends the compressed M3 message to entity B (step 555). When entity B receives the compressed message M3, it decompresses M3 using its current decompressor dictionary (450) containing M1 (step 560). In addition, entity B adds M2 to its compressor dictionary (460) (step 565). Entity B then adds M3 to its decompressor dictionary (step 570). When entity B sends a response, M4, to entity A, entity B compresses M4 using the compressor dictionary (450) containing M2 (step 575). Entity B temporarily stores M4 and sends the compresses message M4 to entity A (step 580). When entity A receives the response message M4, entity A decompresses M4 using the decompressor dictionary (430) containing M2 (step 585), and adds M3 to its compressor dictionary (420) (step 590). Entity A then adds M4 to its decompressor dictionary (430) (step 595).

The system and method of the present invention for updating compression and decompression dictionaries provide for the benefit of a greatly increased compression efficiency by using the request-reply nature of communication protocols to provide for fast dictionary updates. In addition, the present invention provides for robustness since updates to a dictionary are not performed until the communication entity is aware that the other communication entity has access to the new part of the dictionary. Hence, if a message is lost, the dictionaries will not be updated, and the next request will be compressed with the dictionary that was used to compress the lost message. Similarly, the present method allows for robustness in instances when a strict request-reply sequence is not followed. In this way, communication entities may retain matching dictionaries regardless of whether a communication message was not sent or was lost during transmission.

Although various embodiments of the method, system, and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the scope of the invention as set forth and defined by the following claims.

What is claimed is:

1. A method of facilitating compressed message communication between a first communication entity and a second communication entity, said method comprising the steps of:

compressing, at said first communication entity, a portion of a first communication message using a first dictionary to produce a first compressed communication message;

transmitting said first compressed communication message to said second communication entity;

receiving said first compressed communication message at said second communication entity;

decompressing, at said second communication entity, said first compressed communication message using a second dictionary to reproduce said first communication message;

adding said portion of said first communication message to said second dictionary;

compressing, at said second communication entity, a portion of a second communication message using said second dictionary to produce a second compressed communication message;

transmitting said second compressed communication message to said first communication entity;

receiving said second compressed communication message at said first communication entity;

in response to receiving said second compressed communication message, adding said portion of said first communication message to said first dictionary; and decompressing, at said first communication entity, said second compressed communication message using said first dictionary to reproduce said second communication message; and adding said portion of said second communication message to said first dictionary.

2. The method of claim 1, wherein said step of transmitting said first compressed communication message and said step of transmitting said second compressed communication message comprises transmitting over a wireless interface.

3. The method of claim 1, said method further comprising the steps of:

compressing, at said first communication entity, a portion of a third communication message using said first dictionary to produce a third compressed communication message;

transmitting said third compressed communication message to said second communication entity;

receiving said third compressed communication message at said second communication entity;

in response to receiving said third compressed communication message, adding said portion of said second communication message to said second dictionary; and decompressing, at said second communication entity, said third compressed communication message using said second dictionary to reproduce said third communication message.

4. A method of facilitating compressed message communication between a first communication entity and a second communication entity, said method comprising the steps of:

compressing, at said first communication entity, a portion of a first communication message using a first dictionary to produce a first compressed communication message;

transmitting said first compressed communication message to said second communication entity;

receiving said first compressed communication message at said second communication entity;

decompressing, at said second communication entity, said first compressed communication message using a second dictionary to reproduce said first communication message;

adding said portion of said first communication message to said second dictionary, compressing, at said second communication entity, a portion of a second communication message using a third dictionary to produce a second compressed communication message;

transmitting said second compressed communication message to said first communication entity;

receiving said second compressed communication message at said first communication entity;

adding said portion of said first communication message to said first dictionary;

decompressing, at said first communication entity, said second compressed communication message using a fourth dictionary to reproduce said second communication message; and adding said portion of said second communication message to said fourth dictionary.

5. A communication device, comprising:

a receiver unit;

a transmitter unit;

a processor; and memory having stored therein at least one dictionary and program software having instructions which, when executed by the processor, causes the communication device to:

compress, using at least one dictionary, a portion of a communication message to obtain a compressed portion thereof;

transmit by said transmitter, unit, said communication message having the compressed portion to a second communication device; and add the portion of said communication message which was previously compressed to said at least one dictionary after receiving a reply communication message sent by the second communication device to said receiver unit.

6. The communication device of claim 5, wherein said at least one dictionary comprises a first dictionary for storing said portion of the communication message and a second dictionary for storing at least one portion of the reply communication message received by said receiver unit.

7. The communication device of claim 5, wherein said communication device comprises a mobile terminal.

8. The communications device of claim 5, wherein said communication device comprises a SIP communication node.

9. The communications device of claim 5, wherein said another communications device comprises a mobile terminal.

10. The communications device of claim 5, wherein said another communications device comprises a SIP communication node.

11. A communication system for facilitating compressed message communication, said communication system comprising:

a first communication entity for sending a first communication message, said first communication entity comprising:

a first receiving means;

a first dictionary;

a first compressor, in communication with said first dictionary, said first compressor using said first dictionary to compress a portion of a first communication message to produce a first compressed communication message;

a first transmitting means, in communication with said first compressor, for transmitting said first compressed communication message to a second communication entity;

a first decompressor;

a first updating means, in communication with said first decompressor and said first dictionary, for adding said portion of said first communication message to said first dictionary after said first communication entity receives a reply message sent by the second communication entity in response to receiving the first compressed communication message; and said second communication entity comprising:

a second receiving means for receiving said first compressed communication message;

a second dictionary;

a second decompressor, in communication with said second receiving means and said second dictionary, for decompressing said first compressed communication message using said second dictionary to reproduce said first communication message; and a second updating means, in communication with said second decompressor and said second dictionary, for updating said portion of said first communication message to said second dictionary.

12. The communication system of claim 11, said second communication entity further comprising:

a second compressor, in communication with said second dictionary, for compressing a portion of a second communication message using said second dictionary to produce a second compressed communication message; and a second transmitting means, in communication with said second compressor, for transmitting said second compressed communication message to said first communication entity.

13. The communication system of claim 12, said first communication entity further comprising:

said first receiving means for receiving said second compressed communication message; and said first decompressor, in communication with said first receiving means and said first dictionary, for decompressing said second compressed communication message using said first dictionary to reproduce said second communication message.

* * * * *